March 13, 1962 C. Z. LEINKRAM ETAL 3,024,519

COLD WELD SEMICONDUCTOR HOUSING

Filed July 19, 1960

INVENTOR.
CHARLES Z. LEINKRAM
HENRY G. SCHOLER
BY
James M. Nickels
ATTORNEY 3,024,519

COLD WELD SEMICONDUCTOR HOUSING

Charles Zachary Leinkram, Asbury Park, and Henry Gardner Scholer, Carteret, N.J., assignors to The Bendix Corporation, Eaton, N.J., a corporation of Delaware Filed July 19, 1960, Ser. No. 43,942
2 Claims. (Cl. 29—25.3)

The present invention relates to semiconductor devices and more particularly to means and methods of encapsulating such devices.

It is necessary that semiconductor devices be hermetically sealed from the atmosphere in order to secure a long life and stability of operation. Further devices such as power transistors and rectifiers, which in their operation appreciable amounts of heat are generated, must be able to dissipate such heat. The semiconductor element is usually mounted on a metal base which must have a flat surface to make good thermal contact with a heat sink or chassis upon which the device is mounted.

Heretofore it has been the practice to use electrical welding to seal the dome to the platform. This method has the disadvantage in that the heat necessary to produce a suitable weld may damage the semiconductor element or cause warping of the base.

The present invention provides means and a method in which the dome may be secured to the platform by a cold weld without distortion of the platform. A weld ring is provided which serves as an anvil for the cold weld.

It is an object of the invention to provide an improved semiconductor device.

Another object of the invention is to provide an improved housing for a semiconductor device.

Another object of the invention is to provide an improved method of fabricating a semiconductor device.

Another object of the invention is to provide improved means for encapsulating a semiconductor device.

Another object of the invention is to provide a process for assemblying a semiconductor device that is inexpensive and easy.

The above and other objects and features of the invention will appear more fully hereinafter from a consideration of the following description taken in conjuction with the accompanying drawing wherein three embodiments of the invention are illustrated by way of examples.

Figures 1, 2, 3, 4, 5, 6, 7:
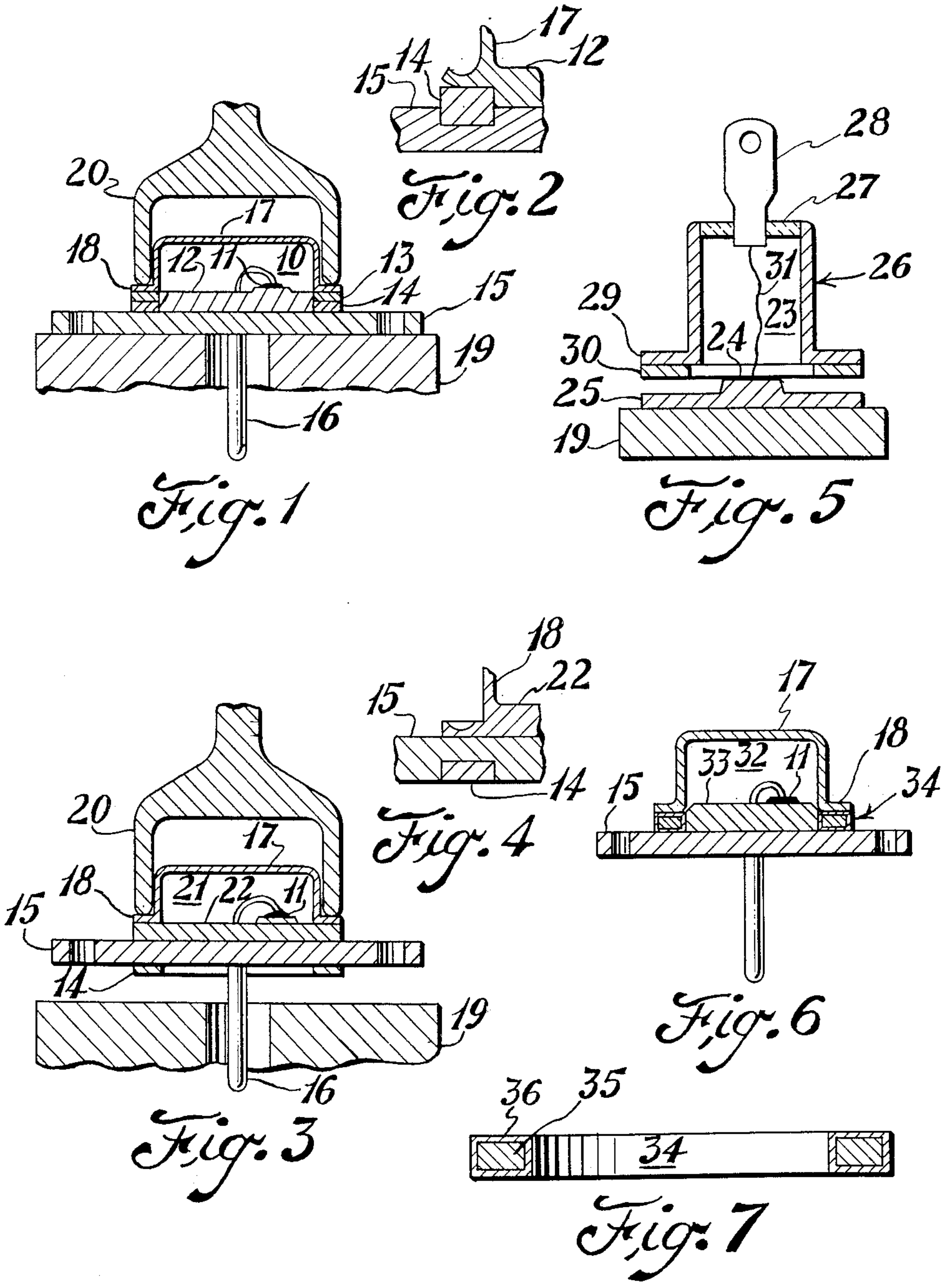
FIGURE 1 is a sectional view of a semiconductor device positioned for cold welding in accordance with one embodiment of the invention.
FIGURE 2 is an enlarged section of a weld made in accordance with the embodiment of FIGURE 1.
FIGURE 3 is a sectional view of a semiconductor device positioned for cold welding in accordance with another embodiment of the invention.
FIGURE 4 is an enlarged section of a weld made in accordance with the embodiment of FIGURE 3.
FIGURE 5 is a sectional view of a diode illustrating another embodiment of the invention.
FIGURE 6 is a sectional view of a device in accordance with a further embodiment of the invention.
FIGURE 7 is an enlarged sectional view of the weld ring of FIGURE 6.

Referring now to the drawing wherein similar parts in the various figures have been assigned the same reference numerals, in FIGURE 1 a semiconductor device is indicated generally by the numeral 10 and for the purpose of illustration may be a transistor ready for encapsulation. The device 10 has a wafer of suitable semiconductor material 11, such, for example, as germanium or silicon which has been processed in a conventional manner. The wafer 11 is mounted on a copper disc 12 which has a plating of nickel thereon. The disc 12 has a circumferential flange 13 which is adapted to fit over a weld ring 14. The weld ring 14 is of a material substantially harder than the copper, for example, carbon steel which may be plated with nickel. The disc 12 and ring 14 are mounted on a copper platform 15 and secured thereby by brazing or any other conventional manner. The platform 15 may be nickel plated and has mounting holes therein.

In the assembly of the device 10, the disc 12 and weld ring 14 are positioned on the platform 15 and are welded or brazed thereto in a conventional manner. A semiconductor element is mounted on the disc 12 and is connected in the conventional manner to pins 16. A dome or cap 17 having a flange 18 is then placed over the aforenoted assembly with the flange 18 concentric with the flange 13 of the disc 12 and weld ring 14. The dome 17 may be of copper with a nickel plating thereon. The assembly is then placed on a flat anvil or die 19. A pressure applying tool 20 is brought down upon the flange 18 of the dome 17 and pressure applied to cause the flanges 13 and 18 to flow together and form a pressure weld as shown in FIGURE 2. The weld ring 14 serves as a backing plate or anvil for the weld and is forced partially into the platform 15. The nickel plating on the copper parts prevents oxidation thereof yet does not affect the cold weld.

Referring now to FIGURE 3, a semiconductor device is indicated generally by the numeral 21 and only the difference between it and the device 10 will be described in detail. The device 21 has a disc 22 which may be of copper and having a plating of nickel thereon. A semiconductor element 11 is mounted on the disc 22 and the connections made in a conventional manner. The disc 22 is secured to the platform 15 by brazing or any other conventional manner. A weld ring 14 is provided and is placed on the side of the platform opposite from the disc 22.

In the assembly of the device 21, the disc 22 is placed on the platform 15 and brazed thereto. The semiconductor element 11 is then mounted on the disc 22 and the connections made thereto. The dome 17 is then placed on the disc 22 and the weld ring 14 on the underside of the platform 15 in alignment with the flange 18 of the dome 17. Next the assembly is placed on the anvil 19 and pressure is applied to tool 20 to cause the flange 18 and disc 22 to flow together and form a cold weld as illustrated in FIGURE 4. The weld ring 14 is forced into the platform 15.

FIGURE 5 is directed to an embodiment of the invention adapted for use in the assembly of diodes such as a rectifier indicated generally by the numeral 23. The diode 23 includes a semiconductor wafer 24 mounted on a platform 25. The platform 25 is of copper and has a nickel plating thereon. A dome or cap 26 has a glass bead 27, through which is sealed a terminal 28, sealed thereto. The dome 26 is of a material such as stainless steel. The dome 26 has a flange 29 to which is secured a copper ring 30 by brazing or welding. A conductor 31 connects the semiconductor wafer to the terminal 28. In the assembly, the dome 26 together with the ring 30 is placed on the platform 25 and pressure is applied as heretofore set forth to cause the ring 30 and platform 25 to flow together to form a cold weld. The flange 29 serves as the weld ring.

FIGURE 6 illustrates another embodiment of the invention in which a semiconductor device 32 includes a disc 33 upon which is mounted a wafer of semiconducting material 11 as heretofore set forth. The disc 33 is secured to a platform 15 in the conventional manner. A weld ring 34 is also secured to the platform 15 and surrounds the disc 33. The weld ring 34 has a steel core 35 surrounded by a layer of copper 36 as illustrated in FIG- URE 7. The dome 17 is placed in position and processed by applying pressure as heretofore set forth to form a cold weld between the flange 18 of the dome 17 and the copper 36 on the weld ring 34.

Although several embodiments of the invention have been illustrated and described, various changes in the form and relative arrangement of the parts which will now appear to those skilled in the art, may be made without departing from the scope of the invention.

What is claimed is:

1. A method of fabricating a semiconductor device comprising brazing a copper disc and a steel weld ring to a copper platform, mounting a semiconductor wafer on said copper disc, placing a cap over said copper disc, and supplying pressure against said weld ring to cause said cap and copper disc to flow together to form a seal therebetween.

2. A method of fabricating a semiconductor device comprising making a platform assembly of a platform and a mounting disc, mounting a wafer of semiconductor material on said disc, placing a weld ring underneath said platform assembly, positioning a cap over said mounting disc and in alignment wtih said weld ring, and applying pressure between said cap and said weld ring to form a pressure weld between said cap and said platform.

References Cited in the file of this patent

UNITED STATES PATENTS

| | | |
|---|---|---|
| 2,922,935 | Dolder | Jan. 26, 1960 |
| 2,962,394 | Andres | Nov. 29, 1960 |
| 2,963,632 | Kilian et al. | Dec. 6, 1960 |